(12) United States Patent
Kakebe

(10) Patent No.: US 11,539,349 B1
(45) Date of Patent: Dec. 27, 2022

(54) INTEGRATED CIRCUIT AND POWER MODULE

(71) Applicant: FUJI ELECTRIC CO., LTD., Kawasaki (JP)

(72) Inventor: Isao Kakebe, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/726,904

(22) Filed: Apr. 22, 2022

(30) Foreign Application Priority Data

Jun. 30, 2021 (JP) .............................. JP2021-108758

(51) Int. Cl.
*H03K 17/296* (2006.01)
*H03K 3/011* (2006.01)
*H03K 5/01* (2006.01)
*H03K 19/20* (2006.01)
*H03K 5/00* (2006.01)

(52) U.S. Cl.
CPC ............... *H03K 3/011* (2013.01); *H03K 5/01* (2013.01); *H03K 19/20* (2013.01); *H03K 2005/00013* (2013.01)

(58) Field of Classification Search
CPC .......... H03K 3/011; H03K 5/01; H03K 19/20; H03K 2005/00013
USPC ........................................................ 327/396
See application file for complete search history.

(56) References Cited

U.S. PATENT DOCUMENTS

| | | | | |
|---|---|---|---|---|
| 6,268,986 | B1* | 7/2001 | Kobayashi | H03K 17/0828 361/25 |
| 6,291,826 | B1* | 9/2001 | Kubo | H01L 29/7395 257/E29.198 |
| 6,342,997 | B1* | 1/2002 | Khadkikar | G01K 3/005 361/103 |
| 6,753,674 | B2* | 6/2004 | Grundl | H02M 7/003 323/224 |
| 6,930,371 | B2* | 8/2005 | Necco | H01L 29/868 257/659 |
| 9,236,826 | B2* | 1/2016 | Djonga | H02P 27/06 |
| 9,300,130 | B2* | 3/2016 | Tsunekawa | H02M 7/003 |

(Continued)

FOREIGN PATENT DOCUMENTS

| | | |
|---|---|---|
| JP | 2013-219633 A | 10/2013 |
| JP | 2018-157670 A | 10/2018 |
| JP | 2019-110677 A | 7/2019 |

*Primary Examiner* — Ryan Jager
(74) *Attorney, Agent, or Firm* — Rabin & Berdo, P.C.

(57) ABSTRACT

An integrated circuit includes a signal output circuit configured to output a timing signal indicating first and second timings of respectively switching first and second switching devices, first and second hold circuits respectively configured to receive first and second voltages corresponding to temperatures of the first and second switching devices, hold the first and second voltages for first and second time periods, and output the received first and second voltages in response to the first and second time periods having elapsed, and first and second control circuits respectively configured to control switching of the first and second switching devices with first and second driving capabilities corresponding to the temperatures of the first and second switching devices, based on the first and second voltages outputted from the first and second hold circuits and first and second driving signals for driving the first and second switching device.

8 Claims, 9 Drawing Sheets

(56) References Cited

U.S. PATENT DOCUMENTS

| | | | |
|---|---|---|---|
| 9,601,984 B2* | 3/2017 | Hamanaka | H02M 3/1588 |
| 10,116,213 B2* | 10/2018 | Shimizu | H01L 29/7393 |
| 10,260,967 B2* | 4/2019 | Jang | G01K 15/005 |
| 10,615,737 B1* | 4/2020 | Pacha | G01K 7/01 |
| 10,700,594 B2* | 6/2020 | Nakamori | H03K 17/0826 |
| 11,152,887 B2* | 10/2021 | Kimura | H02M 1/32 |
| 2005/0088863 A1* | 4/2005 | Pearce | G01K 7/01 |
| | | | 374/E7.035 |
| 2008/0100978 A1* | 5/2008 | Maebara | H03K 17/0828 |
| | | | 361/93.8 |
| 2011/0317315 A1* | 12/2011 | Motohashi | H02H 7/122 |
| | | | 361/18 |
| 2012/0112530 A1* | 5/2012 | Komatsu | B60L 15/007 |
| | | | 307/9.1 |
| 2013/0106470 A1* | 5/2013 | Takagiwa | G01R 31/2607 |
| | | | 327/109 |
| 2014/0009983 A1* | 1/2014 | Nakamori | H02M 1/084 |
| | | | 363/50 |
| 2014/0092655 A1* | 4/2014 | Igarashi | H02H 7/122 |
| | | | 363/56.05 |
| 2015/0168462 A1* | 6/2015 | Singh | G01R 19/0092 |
| | | | 702/64 |
| 2016/0052541 A1* | 2/2016 | Nakayama | B62D 5/0481 |
| | | | 701/41 |
| 2017/0077862 A1* | 3/2017 | Heiling | G01K 7/00 |
| 2020/0204102 A1* | 6/2020 | Malrait | H02P 3/18 |
| 2021/0006240 A1* | 1/2021 | Schläfli | H03K 17/90 |
| 2022/0069815 A1* | 3/2022 | Minagawa | G01R 19/16566 |
| 2022/0224243 A1* | 7/2022 | Alvarez Valenzuela | |
| | | | H02M 7/219 |

* cited by examiner

| | RELATIONSHIP BETWEEN ToX, Vref1, AND Vref2 | OUTPUT OF COMPARATOR 51 | OUTPUT OF COMPARATOR 52 | SW1 | SW2 | SW3 |
|---|---|---|---|---|---|---|
| LOW TEMPERATURE | ToX>Vref1>Vref2 | L | L | ON | OFF | OFF |
| MEDIUM TEMPERATURE | Vref1>ToX>Vref2 | H | L | OFF | ON | OFF |
| HIGH TEMPERATURE | Vref1>Vref2>ToX | H | H | OFF | OFF | ON |

FIG. 6

INTEGRATED CIRCUIT AND POWER MODULE

CROSS-REFERENCE TO RELATED APPLICATION

The present application claims priority pursuant to 35 U.S.C. § 119 from Japanese patent application number 2021-108758 filed on Jun. 30, 2021, the entire disclosure of which is hereby incorporated by reference herein.

BACKGROUND

Technical Field

The present disclosure relates to an integrated circuit and a power module.

Description of the Related Art

Intelligent power modules (IPM) for power converters include: a semiconductor chip having formed therein a switching device, such as an insulated gate bipolar transistor (IGBT), and a diode for temperature detection; and an integrated circuit (IC) that drives the switching device according to the result of detection of the diode (for example, see Japanese Patent Application Publications Nos. 2019-110677, 2013-219633, and 2018-157670).

In IPMs described in Japanese Patent Application Publications Nos. 2019-110677, 2013-219633, and 2018-157670, the driving capability for the switching device is adjusted based on the voltage of the diode (in other words, the temperature of the switching device). Furthermore, noise generated in driving the switching device is prevented from affecting the voltage of the diode in the same chip.

However, a plurality of such semiconductor chips as above are provided with respect to a load (multiple combinations of the switching device and diode are provided), noise generated in driving the switching device in one of the semiconductor chips may affect the voltage (noise may be generated in the voltage) of the diode in another semiconductor chip.

SUMMARY

An aspect of an embodiment of the present disclosure is an integrated circuit for controlling a power module that includes a first switching device and a second switching device, the integrated circuit comprising: a signal output circuit configured to output a timing signal indicating a first timing of switching the first switching device and a second timing of switching the second switching device; a first hold circuit configured to receive a first voltage corresponding to a temperature of the first switching device and the timing signal, hold the first voltage for a first time period in response to receiving the timing signal, and output the received first voltage in response to the first time period having elapsed; a second hold circuit configured to receive a second voltage corresponding to a temperature of the second switching device and the timing signal, hold the second voltage for a second time period in response to receiving the timing signal, and output the received second voltage in response to the second time period having elapsed; a first control circuit configured to receive the first voltage outputted from the first hold circuit and a first driving signal for driving the first switching device, and control the switching of the first switching device with a first driving capability corresponding to the temperature of the first switching device, based on the first voltage received from the first hold circuit and the first driving signal; and a second control circuit configured to receive the second voltage outputted from the second hold circuit and a second driving signal for driving the second switching device, and control the switching of the second switching device with a second driving capability corresponding to the temperature of the second switching device, based on the second voltage received from the second hold circuit and the second driving signal.

BRIEF DESCRIPTION OF THE DRAWINGS

FIG. 6 is a diagram illustrating an operational relationship in a driving-capability adjustment circuit 50X.

DETAILED DESCRIPTION

At least following matters will become apparent from the descriptions of the present specification and the accompanying drawings.

Embodiments

<<<Entire Configuration of Power Module 1>>>

Figure 1:
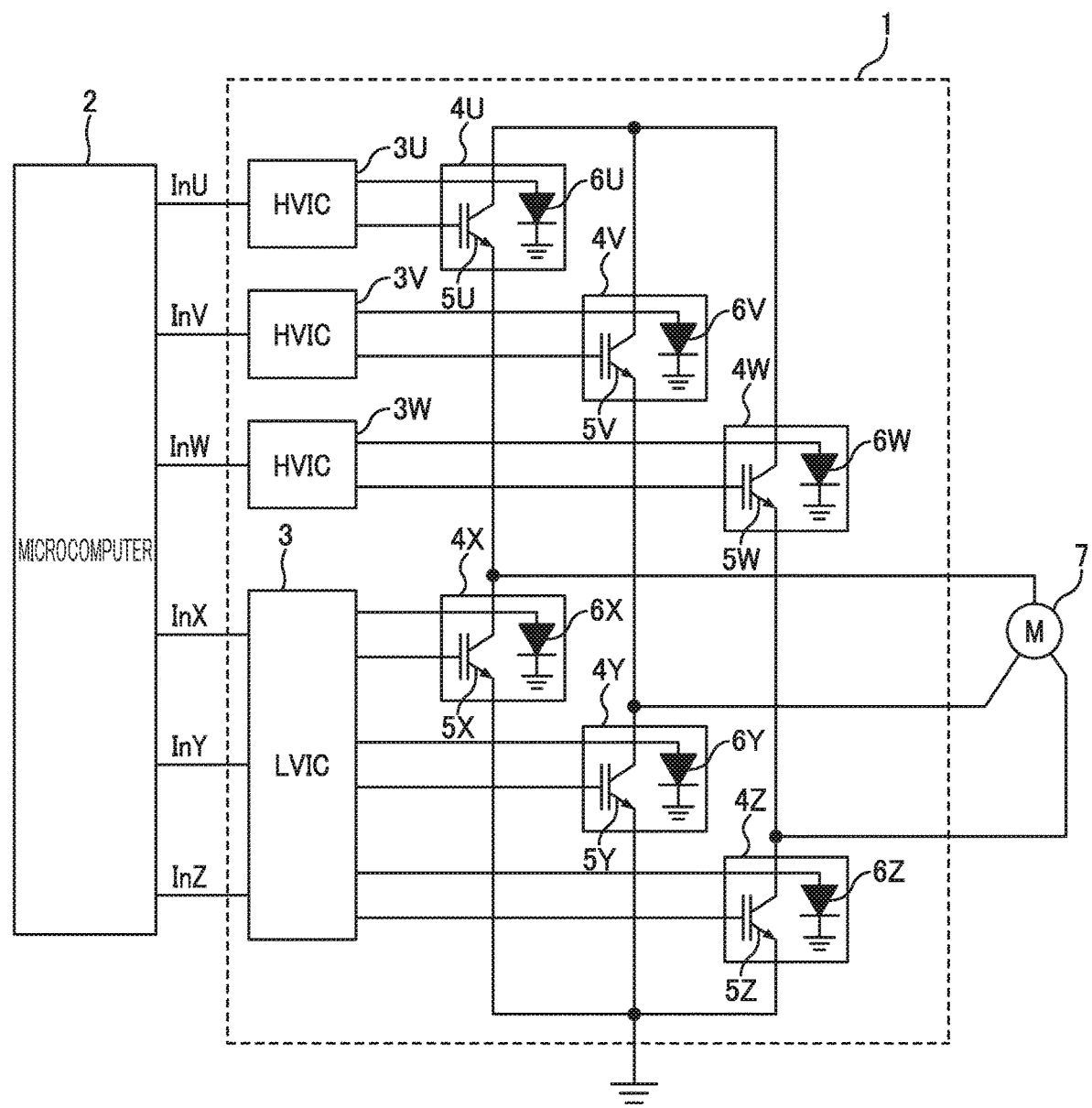
FIG. 1 is a block diagram illustrating an entire configuration of a power module 1.

FIG. 1 is a block diagram illustrating the entire configuration of a power module 1 according to an embodiment of the present disclosure.

The power module 1 according to an embodiment of the present disclosure is an intelligent power module (IPM) that drives a three-phase motor 7 serving as a load, in response to an instruction from a microcomputer 2. The power module 1 includes semiconductor chips 4U, 4V, 4W, 4X, 4Y, and 4Z, a Low Voltage Integrated Circuit (LVIC) 3, and High Voltage Integrated Circuits (HVICs) 3U, 3V, and 3W.

The semiconductor chip 4U includes a U-phase switching device 5U and a diode 6U for detecting the temperature of the switching device 5U. The semiconductor chips 4V, 4W, 4X, 4Y, and 4Z similarly include switching devices 5V, 5W, 5X, 5Y, and 5Z with respect to phases (V-, W-, X-, Y-, and Z-phases), respectively, and diodes 6V, 6W, 6X, 6Y, and 6Z for detecting temperatures of the switching devices 5V, 5W, 5X, 5Y, and 5Z, respectively.

In an embodiment of the present disclosure, the switching devices 5U, 5V, 5W, 5X, 5Y, and 5Z are insulated gate bipolar transistors (IGBTs). The switching devices 5U, 5V, 5W, 5X, 5Y, and 5Z are not limited to IGBTS and may be bipolar transistors or metal-oxide-semiconductor (MOS) transistors, for example.

The HVICs 3U, 3V, and 3W are integrated circuits (ICs) that switches the switching devices 5U, 5V, and 5W on the upper arm side of a bridge circuit using driving signals InU, InV, and InW received from the microcomputer 2, respectively.

The LVIC 3 is an integrated circuit (IC) that switches the switching devices 5X, 5Y, and 5Z on the lower arm side of the bridge circuit using driving signals InX, InY, and InZ received from the microcomputer 2, respectively.

<<Configuration Example on Lower Arm Side>>

Figure 2:
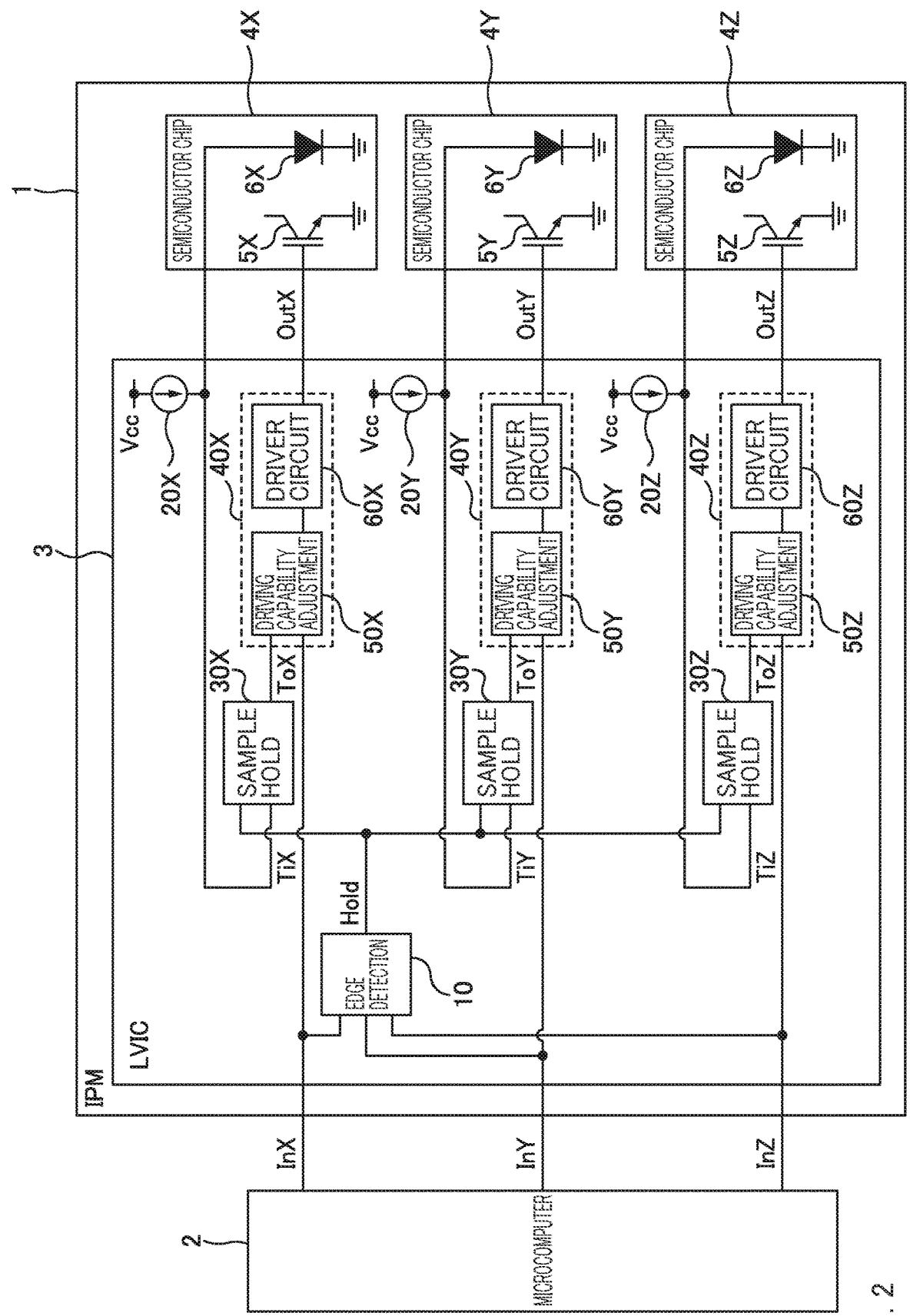
FIG. 2 is a block diagram illustrating an example of a configuration on a lower arm side.

FIG. 2 is a block diagram illustrating an example of a configuration on the lower arm side.

As illustrated in FIG. 2, the semiconductor chips 4X, 4Y, and 4Z and LVIC 3 are provided on the lower arm side of the power module 1.

<Configuration of Semiconductor Chip>

The semiconductor chip 4X includes the switching device 5X and the diode 6X in the same chip as described above.

The switching device 5X drives the three-phase motor 7. The switching device 5X is turned on and off in response to a signal OutX applied to the gate thereof from the LVIC 3, and passes current from the collector to the emitter (ground), in response to being turned on.

The diode 6X is a diode for temperature detection to detect chip temperature (more specifically, operating temperature of the switching device 5X). In the semiconductor chip 4X, the diode 6X is provided corresponding to the switching device 5X (in an optimal area for temperature detection), and the cathode thereof is grounded while the anode thereof is coupled to a constant current source 20X of the LVIC 3. With constant current being supplied from the constant current source 20X of the LVIC 3 to the diode 6X, voltage (forward voltage) is generated across the diode 6X according to the temperature. Accordingly, based on the voltage generated across the diode 6X, the operating temperature of the switching device 5X can be detected by using the temperature dependence of the diode 6X. In FIG. 2, the semiconductor chip 4X includes the single diode 6X for the sake of simplicity, but the present disclosure is not limited thereto. The semiconductor chip 4X may include a plurality of diodes 6X coupled in series, for example.

The semiconductor chips 4Y and 4Z have the same configuration as that of the semiconductor chip 4X, and thus the description thereof is omitted.

Note that any one of the semiconductor chips 4X, 4Y, and 4Z (herein, the semiconductor chip 4X) corresponds to a "first semiconductor chip". The switching device 5X provided to the semiconductor chip 4X corresponds to a "first switching device", and the diode 6X corresponds to a "first diode". The output (a voltage TiX) of the diode 6X corresponds a "first voltage".

In addition, any one of the semiconductor chips 4X, 4Y, and 4Z (herein, the semiconductor chip 4Y) other than the first semiconductor chip corresponds to a "second semiconductor chip". The switching device 5Y provided to the semiconductor chip 4Y corresponds to a "second switching device", and the diode 6Y corresponds to a "second diode". The output (voltage TiY) of the diode 6Y corresponds to a "second voltage".

<Configuration of LVIC 3>

The LVIC 3 has a function of adjusting driving capabilities for the switching devices 5X, 5Y, and 5Z according to operating temperatures (voltages of the diodes 6X, 6Y, and 6Z) of the switching devices 5X, 5Y, and 5Z, respectively. As illustrated in FIG. 2, the LVIC 3 includes an edge detection circuit 10, constant current sources 20X, 20Y, and 20Z, sample hold circuits 30X, 30Y, and 30Z, and control circuits 40X, 40Y, and 40Z. Among the aforementioned circuits, the circuits other than the edge detection circuit 10 are provided corresponding to the semiconductor chips 4X, 4Y, and 4Z (X-, Y-, and Z-phases), respectively. The configurations of these circuits (the circuits other than the edge detection circuit 10) are the same across the phases. Hereinafter, part corresponding to the X-phase (the semiconductor chip 4X; the first semiconductor chip) will be mainly described, without describing other part.

The edge detection circuit 10 detects falling and rising edges of each of the driving signals InX, InY, and InZ inputted to the LVIC 3 from the microcomputer 2 and outputs a signal Hold containing pulses having a predetermined pulse width, according to the results of detection. In an embodiment of the present disclosure, the edge detection circuit 10 corresponds to a "signal output circuit", and the signal Hold corresponds to a "timing signal" indicating switching timings of the switching devices 5X, 5Y, and 5Y. The detail of the edge detection circuit 10 will be described later.

The constant current source 20X generates a predetermined constant current from a power supply voltage VCC and supplies the generated constant current to the anode of the diode 6X.

Figure 5:
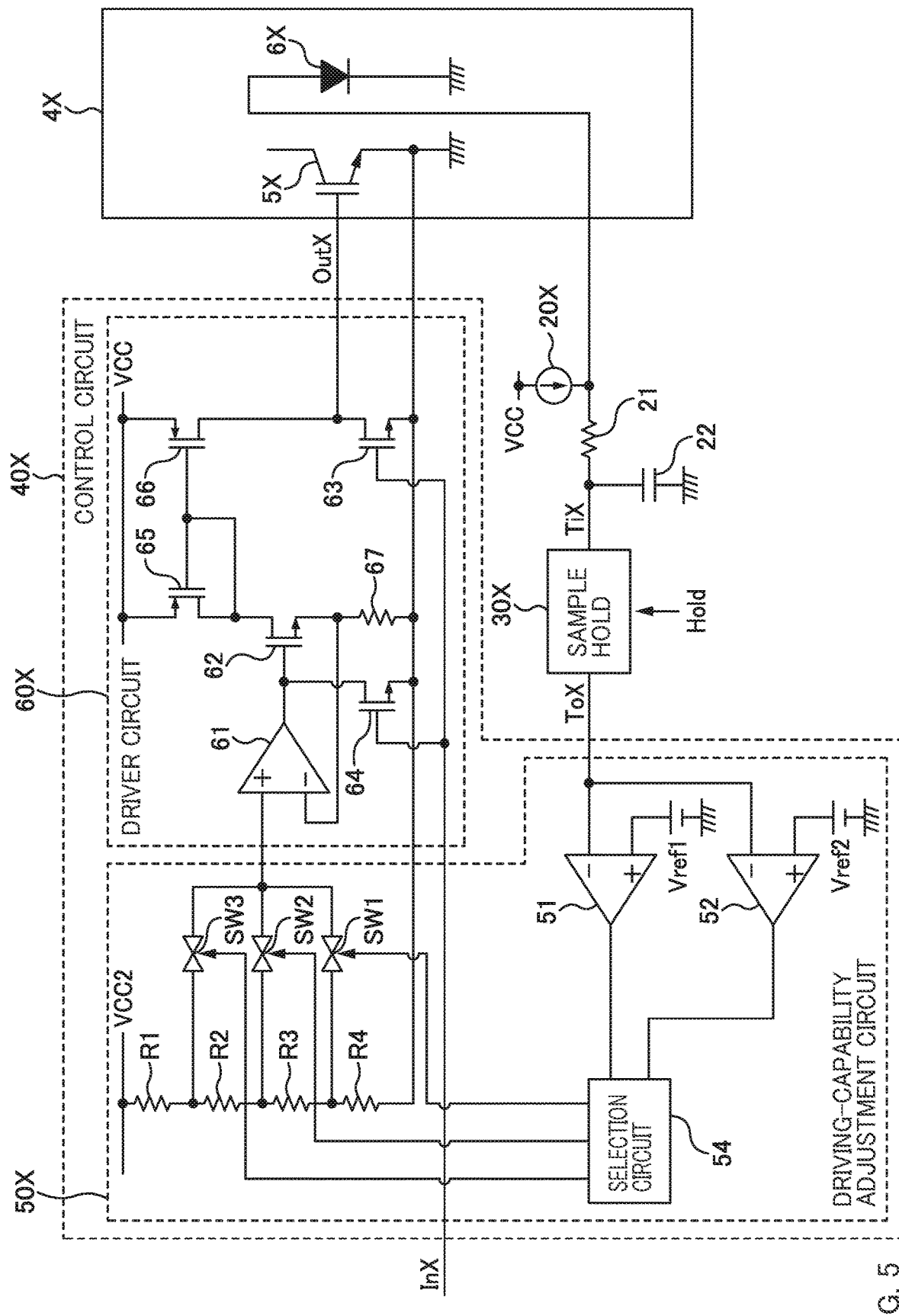
FIG. 5 is a circuit diagram illustrating an example of a configuration of a control circuit 40X.

The sample hold circuit 30X has a function of holding the output (the voltage TiX) of the diode 6X for a predetermined time period in response to the signal Hold. Specifically, the sample hold circuit 30X receives the output (the voltage TiX) of the diode 6X and the signal Hold. In response to receiving a pulse (described later) of the signal Hold, the sample hold circuit 30X holds the voltage TiX for a predetermined time period (first time period) corresponding to the pulse width. In response to the predetermined time period having elapsed, the sample hold circuit 30X outputs the received voltage TiX as it is. In other words, the output (the voltage ToX) of the sample hold circuit 30X is constant during a time period during which the pulse of the signal Hold is being generated, and is the same as the output (the voltage TiX) of the diode 6X during a time period other than the time period during which the pulse of the signal Hold is being generated (see FIG. 7). As illustrated in FIG. 5, although not being illustrated in FIG. 2, a resistor 21 and a capacitor 22, which configure a filter to remove noise, are provided between the sample hold circuit 30X and the anode of the diode 6X.

The control circuit 40X controls switching of the switching device 5X with a driving capability appropriate to the temperature of the switching device 5X, based on the voltage ToX outputted from the sample hold circuit 30X and the driving signal InX for driving the switching device 5X. The control circuit 40X according to an embodiment of the present disclosure includes a driving-capability adjustment circuit 50X and a driver circuit 60X.

The driving-capability adjustment circuit 50X adjusts the driving capability of the driver circuit 60X with respect to the switching device 5X (specifically, the magnitude of the driving current to be supplied from the driver circuit 60X to the switching device 5X), according to the output of the diode 6X (the output of the sample hold circuit 30X in an embodiment of the present disclosure).

The driver circuit 60X drives the switching device 5X in response to the driving signal InX with the driving capability corresponding to the output of the driving-capability adjustment circuit 50X. A configuration example of the control circuit 40X (the driving-capability adjustment circuit 50X, driver circuit 60X) will be described later.

In an embodiment of the present disclosure, the control circuit 40X with respect to the X-phase corresponds to a "first control circuit", the sample hold circuit 30X corresponds to a "first hold circuit", and the voltage ToX corresponds to the "first voltage". The driving signal InX corresponds to a "first driving signal". The control circuit 40Y with respect to the Y-phase corresponds to a "second control circuit", the sample hold circuit 30Y corresponds to a "second hold circuit", and the voltage ToY corresponds to the "second voltage". The driving signal InY corresponds to a "second driving signal".

The power module 1 according to an embodiment of the present disclosure, for example, detects the temperature of the switching device 5X of the semiconductor chip 4X using the diode 6X, and adjusts the driving capability with respect to the switching device 5X according to the result of detection. In this case, to accurately detect the temperature of the switching device 5X, the voltage of the diode 6X should be accurately detected. However, current that flows in switching the switching device 5X may cause noise, and the noise may be superimposed on a signal coupling the diode 6X and the LVIC 3 (noise may be generated in the voltage TiX of the diode 6X). In this process, such noise may also be generated in voltages (voltages TiY and TiZ) of the diodes 6Y and 6Z of other chips. Similarly, when switching the switching devices (for example, the switching devices 5Y and 5Z) in other chips, noise may be generated in the output of the diode 6X (see FIG. 7). When a plurality of switching devices are provided with respect to a load as such, not only the diode in the same chip as that provided with the switching device to be driven but also the diodes in other chips may be affected by noise. Such noise could prevent the switching devices from operating with appropriate driving capabilities.

Thus, in an embodiment of the present disclosure, the edge detection circuit 10 and sample hold circuits 30X, 30Y, and 30Z are provided, to thereby reduce the effects of noise generated in driving the switching devices in the same chip as well as other chips and enable operations with appropriate driving capabilities.

<<Edge Detection Circuit 10>>

Figure 3:
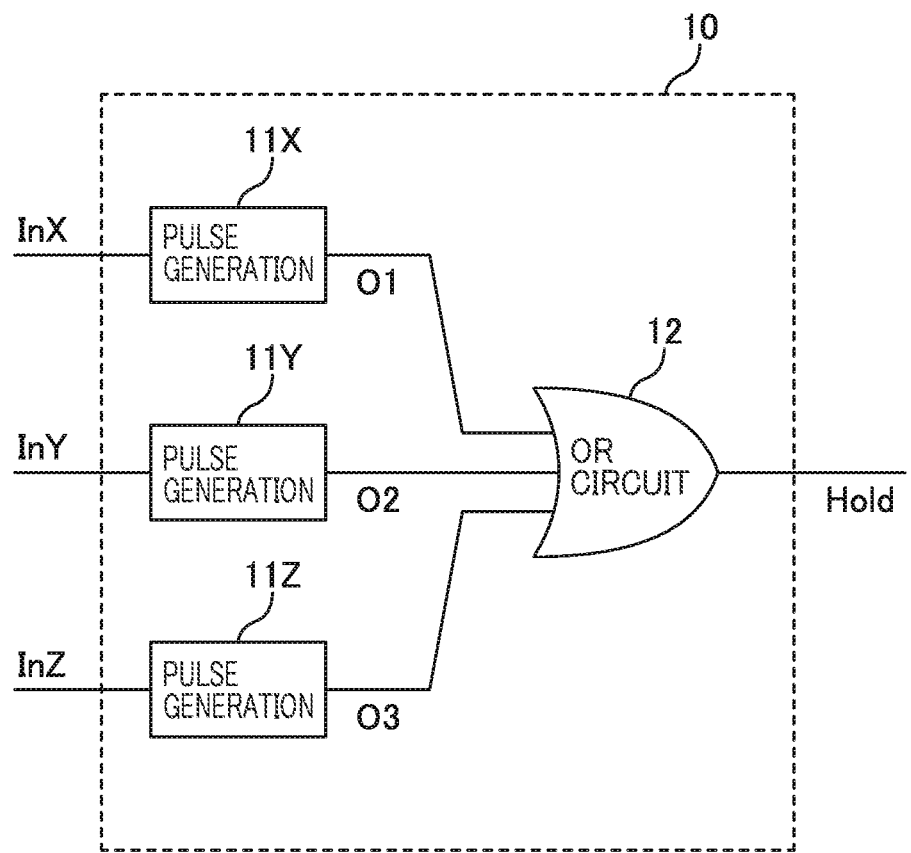
FIG. 3 is a circuit diagram illustrating an example of a configuration of an edge detection circuit 10.
Figure 4:
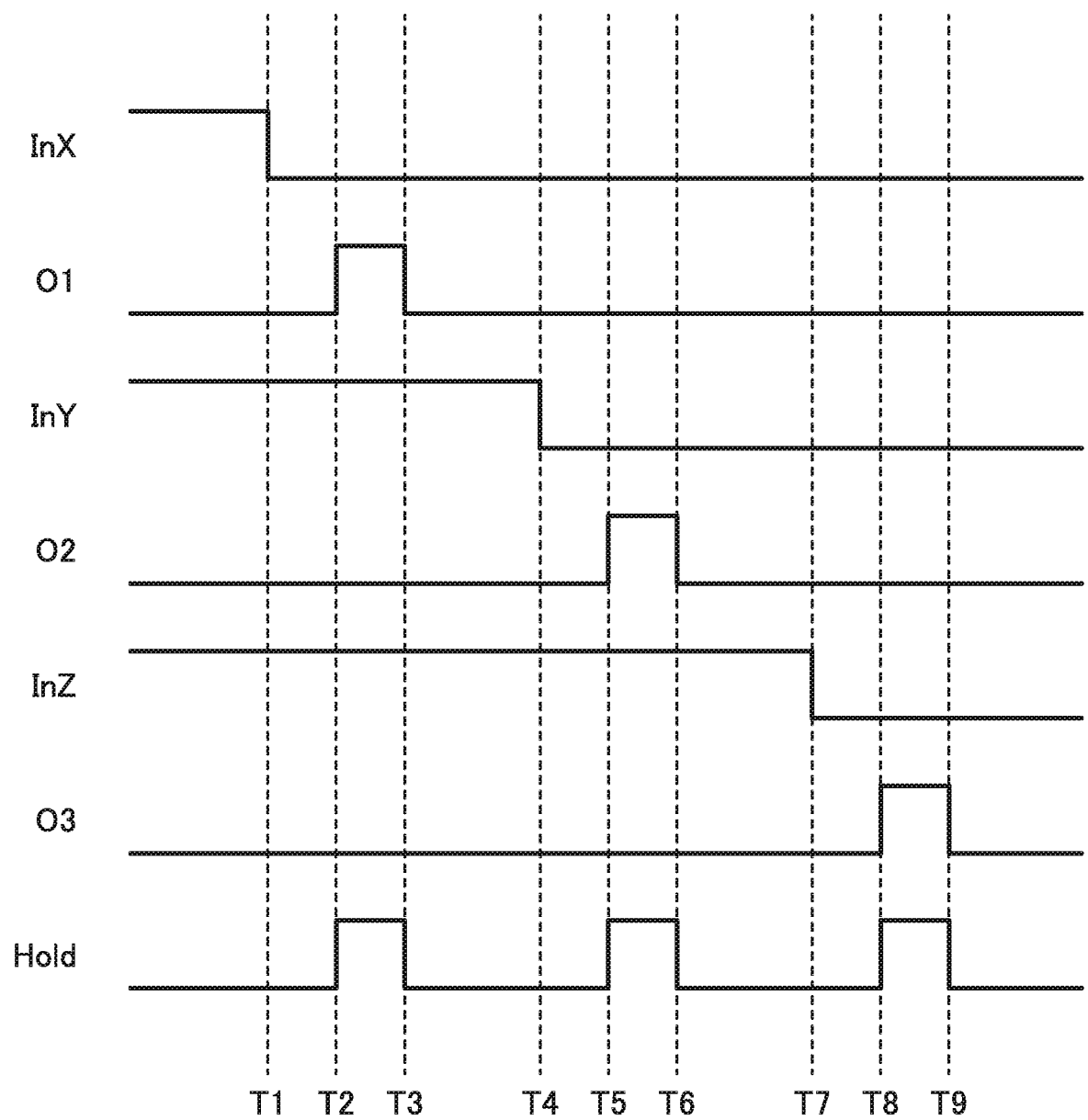
FIG. 4 is a waveform diagram illustrating an example of signal waveforms in an edge detection circuit 10.

FIG. 3 is a circuit diagram illustrating an example of a configuration of the edge detection circuit 10. FIG. 4 is a waveform diagram illustrating an example of signal waveforms in the edge detection circuit 10.

As illustrated in FIG. 3, the edge detection circuit 10 includes pulse generation circuits 11X, 11Y, and 11Z and an OR circuit 12.

The pulse generation circuit 11X receives the driving signal InX. The pulse generation circuit 11X outputs a pulse signal O1 containing a pulse having a predetermined pulse width in response to a change (switching of the logic level) in the driving signal InX. For example, at time T1 in FIG. 4, the driving signal InX falls from a high level (hereinafter, high) to a low level (hereinafter, low). The pulse generation circuit 11X detects a falling edge of the driving signal InX, and outputs the pulse signal O1 containing a pulse having a pulse width of from time T2 to T3. In other words, the pulse generation circuit 11X delays the start timing of the pulse of the pulse signal O1 with respect to the switching timing of the logic level of the driving signal InX. The start timing of the pulse of the pulse signal O1 and the pulse width (time period) thereof are previously determined according to a status of noise occurrence (see FIG. 6).

Similarly, the pulse generation circuit 11Y receives the driving signal InY. Then, the pulse generation circuit 11Y outputs a pulse signal O2 containing a pulse having a predetermined pulse width, in response to a change (switching of the logic level) in the driving signal InY. For example, at time T4 in FIG. 4, the driving signal InY falls from high to low. The pulse generation circuit 11Y detects the falling edge of the driving signal InY, and outputs the pulse signal O2 containing a pulse having a pulse width of from time T5 to T6. In other words, the pulse generation circuit 11Y delays the start timing of the pulse of the pulse signal O2 with respect to the switching timing of the logic level of the driving signal InY.

Similarly, the pulse generation circuit 11Z receives the driving signal InZ. Then, the pulse generation circuit 11Z outputs a pulse signal O3 containing a pulse having a predetermined pulse width, in response to a change (switching of the logic level) in the driving signal InZ. The pulse generation circuit 11Z delays the start timing of the pulse of the pulse signal O3 (time T8 in FIG. 4) with respect to the switching timing of the logic level of the driving signal InZ (time T7 in FIG. 4).

Note that, in an embodiment of the present disclosure, the pulse generation circuit 11X corresponds to a "first pulse generation circuit", and the pulse signal O1 corresponds to a "first pulse signal". The time period during which the pulse of the pulse signal O1 is being generated (from time T2 to T3) corresponds to a "first time period".

In addition, in an embodiment of the present disclosure, the pulse generation circuit 11Y corresponds to a "second pulse generation circuit", and the pulse signal O2 corresponds to a "second pulse signal". The time period during which the pulse of the pulse signal O2 is being generated (from time T5 to T6) corresponds to a "second time period".

The OR circuit 12 calculates and outputs the OR of the pulse signals O1, O2, and O3 as the signal Hold. The OR circuit 12 corresponds to an "output circuit". The signal Hold outputted from the OR circuit 12 is a signal obtained by superimposing the pulses of the pulse signals O1, O2, and O3 as illustrated in FIG. 4. In other words, the signal Hold is a signal indicating timings of switching of the switching devices 5X, 5Y, and 5Z. For example, the pulse from time T2 to T3 in the signal Hold in FIG. 4 indicates the timing in which the switching device 5X is switched in response to the change in the driving signal InX at time T1, and this timing corresponds to a "first timing". The pulse from time T5 to T6 indicates the timing in which the switching device 5Y is switched in response to the change in the driving signal InY at time T4, and this timing corresponds to a "second timing". In an embodiment of the present disclosure (FIG. 4), pulses are generated in response to changes in the driving signals InX, InY, and InZ from high to low (in response to turning on of the switching devices), respectively. However, pulses are also generated in response to changes in the driving signals InX, InY, and InZ from low to high (in response to turning off of the respective switching devices), respectively. Note that a configuration may also be such that pulses are generated only in response to changes in the driving signals InX, InY, and InZ from high to low (in response to turning on of the respective switching devices), respectively.

As such, in an embodiment of the present disclosure, the pulse generation circuits 11X, 11Y, and 11Z delay the timings of start of pulses with respect to the timings of switching of the logic level of the driving signals InX, InY, and InZ, respectively. Accordingly, the pulses are generated in time periods during which noise is likely to be generated, thereby being able to efficiently reduce the effects of noise.

The pulse widths of pulses of the signal Hold (the pulse signals O1 to O3) are shorter than the time periods during which the switching devices 5X, 5Y, and 5Z are on. This shortens the time period during which the results of detection by the diodes 6X, 6Y, and 6Z are not reflected on adjustment of the driving capability (described later).

Note that a delay circuit to delay the signal Hold outputted from the OR circuit 12 may be provided in a stage subsequent to the OR circuit 12, with the pulse generation circuits 11X, 11Y, and 11Z having no delay function. This also can efficiently reduce the effects of noise similarly.

<<Control Circuit 40X>>

FIG. 5 is a circuit diagram illustrating an example of a configuration of the control circuit 40X. As described above, the control circuit 40X controls switching of the switching device 5X with a driving capability appropriate to the temperature of the switching device 5X, based on the voltage ToX outputted from the sample hold circuit 30X and the driving signal InX. The control circuit 40X includes the driving-capability adjustment circuit 50X and the driver circuit 60X.

<Driving-Capability Adjustment Circuit 50X>

The driving-capability adjustment circuit 50X adjusts the driving capability for the switching device 5X according to the result of detection of the diode 6X. Specifically, the driving-capability adjustment circuit 50X controls the driver circuit 60X such that the driving capability for the switching device 5X increases when the voltage of the diode 6X is low (when the temperature is high) and controls the driver circuit 60X such that the driving capability for the switching device 5X decreases when the voltage of the diode 6X is high (when the temperature is low). The driving-capability adjustment circuit 50X according to an embodiment of the present disclosure includes comparators 51 and 52, a selection circuit 54, resistors R1 to R4, and switches SW1 to SW3.

The comparator 51 has an inverting input terminal (−terminal) to receive the voltage ToX outputted from the sample hold circuit 30X, and a non-inverting input terminal (+terminal) to receive a reference voltage Vref1. The reference voltage Vref1 is a voltage serving as a reference for the forward voltage of the diode 6X at a temperature (for example, 110 degrees) between high and medium temperatures. The comparator 51 outputs a low signal in response to the voltage (the voltage ToX) at the −terminal being higher than the voltage (the reference voltage Vref1) at the +terminal, and outputs a high signal in response to the voltage (the voltage ToX) at the −terminal being lower than the voltage (the reference voltage Vref1) at the +terminal.

The comparator 52 has an inverting input terminal (−terminal) to receive the voltage ToX outputted from the sample hold circuit 30X, and a non-inverting input terminal (+terminal) to receive a reference voltage Vref2. The reference voltage Vref2 is a voltage (<the reference voltage Vref1) serving as a reference for the forward voltage of the diode 6X at a temperature (for example, 90 degrees) between medium and low temperatures. The comparator 52 outputs a low signal in response to the voltage (the voltage ToX) at the −terminal being higher than the voltage (the reference voltage Vref2) at the +terminal, and outputs a high signal in response to the voltage (the voltage ToX) at the −terminal being lower than the voltage (the reference voltage Vref2) at the +terminal.

The selection circuit 54 turns on any one of the switches SW1 to SW3 in response to the outputs of the comparators 51 and 52. The selection method of the selection circuit 54 will be described later. Using this selection, the driving capability of the driver circuit 60X for the switching device 5X is adjusted.

The resistors R1 to R4 are coupled in series between a power supply voltage VCC2 (for example, 5 V) and the ground.

One end of the switch SW1 is coupled to a node between the resistors R3 and R4. One end of the switch SW2 is coupled to a node between the resistors R2 and R3. One end of the switch SW3 is coupled to a node between the resistors R1 and R2. The other ends of the switches SW1, SW2, and SW3 are coupled to a non-inverting input terminal (+terminal) of an operational amplifier 61 of the driver circuit 60X, which will be described later.

<Driver Circuit 60X>

The driver circuit 60X switches (turns on and off) the switching device 5X in response to the driving signal InX. The driver circuit 60X drives the switching device 5X with a driving capability corresponding to the output of the driving-capability adjustment circuit 50X.

The driver circuit 60X includes the operational amplifier 61, NMOS transistors 62 to 64, PMOS transistors 65 and 66, and a resistor 67.

The operational amplifier 61 has a non-inverting input terminal (+terminal) to receive the output of the driving-capability adjustment circuit 50X, and an inverting input terminal (−terminal) coupled to one end of the resistor 67 and the source of the NMOS transistor 62. The operational amplifier 61 controls the NMOS transistor 62 such that the voltage at the −terminal is equal to the voltage at the +terminal (the output voltage of the driving-capability adjustment circuit 50X).

The NMOS transistor 62 has a drain coupled to the drain of the PMOS transistor 65, and a gate coupled to the drain of the NMOS transistor 64.

The drain of the NMOS transistor 63 is coupled to the drain of the PMOS transistor 66. The gates of the NMOS transistors 63 and 64 receive the driving signal InX. The sources of the NMOS transistors 63 and 64 and the other end of the resistor 67 are grounded.

The PMOS transistors 65 and 66 constitute a current mirror circuit. The drain of the PMOS transistor 66 is coupled to the gate of the switching device 5X. Accordingly, current having a magnitude corresponding to the current flowing through the PMOS and NMOS transistors 65 and 62 flows through the PMOS transistor 66.

Next, the operation of the driver circuit 60X will be described.

In response to the high driving signal InX being applied to the gates of the NMOS transistors 63 and 64, the NMOS transistors 63 and 64 are turned on. This turns off the NMOS transistor 62, and also turns off the PMOS transistors 65 and 66, which constitute the current mirror circuit. In response to turning on of the NMOS transistor 63, charges are drained from the gate of the switching device 5X, and thus the switching device 5X is turned off.

In response to the low driving signal InX being applied to the gates of the NMOS transistors 63 and 64, the NMOS transistors 63 and 64 are turned off. This turns on the NMOS transistor 62, and also turns on the PMOS transistors 65 and 66, which constitute the current mirror circuit. In response to turning off of the NMOS transistor 63 and turning on of the PMOS transistor 66, charges are supplied to the gate of the switching device 5X, and thus the switching device 5X is turned on.

As described above, current corresponding to the current flowing through the NMOS transistor 62 flows from the PMOS transistor 66 to the switching device 5X. The operational amplifier 61 controls the NMOS transistor 62 such that the voltage at the −terminal of the operational amplifier 61 (the source voltage of the NMOS transistor 62) is equal to the voltage at the +terminal (the output voltage of the driving-capability adjustment circuit 50X). To be more specific, the −terminal of the operational amplifier 61 receives a voltage that is generated across the resistor 67 according to the value of current flowing through the NMOS transistor 62. The operational amplifier 61 controls the value of current flowing through the NMOS transistor 62 such that the difference in voltage between the +terminal and the −terminal is zero. Accordingly, current determined by the +terminal voltage and the resistance value of the resistor R67 flows through the NMOS transistor 62. As the +terminal voltage increases, the current flowing through the NMOS transistor 62 increases in proportion to the magnitude of the +terminal voltage (volume-current conversion). In other words, the current to be supplied from the PMOS transistor 66 to the switching device 5X is determined according to the voltage applied to the +terminal of the operational amplifier 61. In an embodiment of the present disclosure, as the temperature of the switching device increases, the voltage at the +terminal of the operational amplifier 61 increases, and the current flowing through the NMOS transistor 62 (and the PMOS transistor 66) increases, as will be described later.

<<Adjustment of Driving Capability>>

The on resistance of each switching device (for example, the switching device 5X) has temperature dependence and increases as the temperature rises.

If the amount of current supplied to the gate of the switching device 5X from the LVIC 3 is constant irrespective of the temperature, the driving capacity (current supply capacity) to drive the switching device 5X is insufficient at high temperature and excessive at low temperature. In other words, the turn-on time (switching time) increases at high temperature and decreases at low temperature (as the temperature rises, the turn-on time of the switching device 5X increases).

Accordingly, the driving-capability adjustment circuit 50X according to an embodiment of the present disclosure adjusts the driving capability of the driver circuit 60X for the switching device 5X, according to the result of detection of the diode 6X.

Specifically, the driving-capability adjustment circuit 50X reduces the driving capability (the current supply capability) for the switching device 5X when the temperature thereof is low, and increases the driving capability (the current supply capability) for the switching device 5X when the temperature thereof is high. In this manner, the driving-capability adjustment circuit 50X adjusts the magnitude of current to be supplied to the switching device 5X, according to the temperature. The same applies to the driving-capability adjustment circuits 50Y and 50Z.

In an embodiment of the present disclosure, the reference voltage Vref1 is set corresponding to the output voltage (forward voltage) of the diode 6X when the temperature of the switching device 5X is 90 degrees. The reference voltage Vref2 is set corresponding to the output voltage (forward voltage) of the diode 6X when the temperature of the switching device 5X is 110 degrees. As described above, the diode 6X has negative temperature characteristics, and the voltage of the diode 6X drops as the temperature rises, and rises as the temperature drops. The following describes, assuming that the voltage ToX of the sample hold circuit 30X applied to the −terminals of the comparators 51 and 52 is equal to the voltage TiX of the diode 6X.

FIG. 6 is a diagram illustrating the operational relationship in the driving-capability adjustment circuit 50X.

When the operating temperature of the switching device 5X is low (when it is 90 degrees or lower), the voltage ToX (the voltage TiX) is higher than the reference voltages Vref1 and Vref2 as illustrated in FIG. 6. Thus, both of the outputs of the comparators 51 and 52 are low. In this case (when both of the outputs of the comparators 51 and 52 are low), the selection circuit 54 allows conduction of the switch SW1. The +terminal of the operational amplifier 61 receives a voltage (low voltage) obtained by dividing the power supply voltage VCC2 using the resistors R1 to R3 and the resistor R4.

Accordingly, the current flowing through the NMOS transistor 62 results in being small, and the current supplied from the PMOS transistor 66 to the switching device 5X results in being small (the driving capability: low).

In addition, when the operating temperature of the switching device 5X is in a rage from 90 to 110 degrees, the voltage ToX (the voltage TiX) is lower than the reference voltage Vref1 and higher than the reference voltage Vref2, as illustrated in FIG. 6. Thus, the output of the comparator 51 is high, and the output of the comparator 52 is low. In this case (when the output of the comparator 51 is high and the output of the comparator 52 is low), the selection circuit 54 allows conduction of the switch SW2. The +terminal of the operational amplifier 61 thereby receives a voltage (medium voltage) obtained by dividing the power supply voltage VCC2 using the resistors R1 and R2 and the resistors R3 and R4.

Accordingly, the current flowing through the NMOS transistor 62 results in being medium, and the current supplied from the PMOS transistor 66 to the switching device 5X also results in being medium (the driving capability: medium).

In addition, when the operating temperature of the switching device 5X is high (when it is 110 degrees or higher), the voltage ToX (the voltage TiX) is lower than the reference voltages Vref1 and Vref2, as illustrated in FIG. 6. Thus, both of the outputs of the comparators 51 and 52 are high. In this case (when both of the outputs of the comparators 51 and 52 are high), the selection circuit 54 allows conduction of the switch SW3. The +terminal of the operational amplifier 61 thereby receives a voltage (high voltage) obtained by dividing the power supply voltage VCC2 using the resistor R1 and the resistors R2 to R4.

Accordingly, the current flowing through the NMOS transistor 62 results in being large, and the current supplied from the PMOS transistor 66 to the switching device 5X also results in being large (the driving capability: high).

As such, the control circuit 40X of the power module 1 according to an embodiment of the present disclosure adjusts the driving capability for the switching device 5X, according to the temperature of the switching device 5X. The driving capability according to the temperature of the switching device 5X corresponds to a "first driving capability". Similarly, the control circuit 40Y adjusts the driving capability for the switching device 5Y, according to the temperature of the switching device 5Y. The driving capability according to the temperature of the switching device 5Y corresponds to a "second driving capability". The control circuit 40Z adjusts the driving capability for the switching device 5Z, according to the temperature of the switching device 5Z.

The method of adjusting the driving capability is not limited to the aforementioned method, and may be any other methods.

<<Operation Waveform of Power Module 1>>

Figure 7:
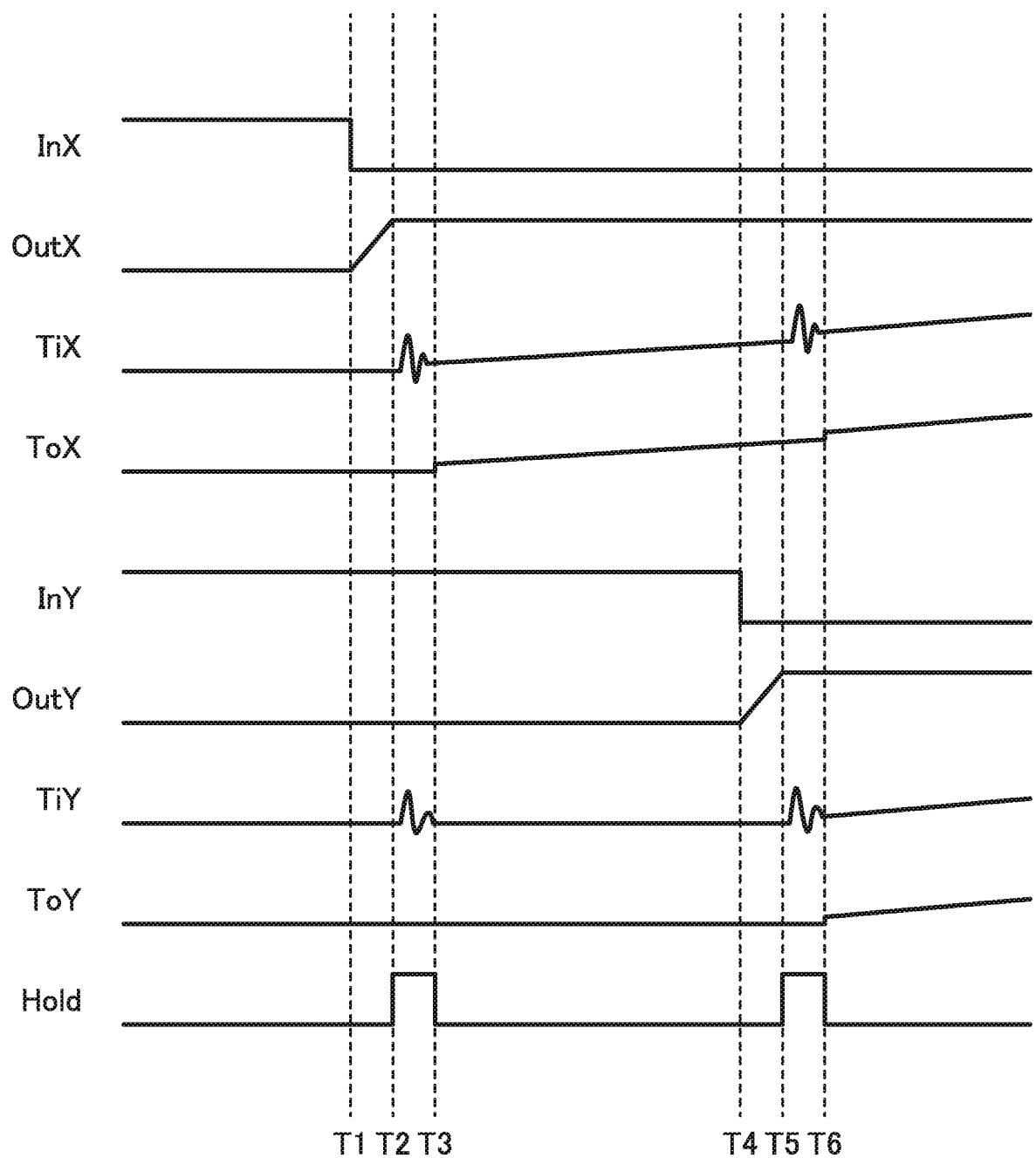
FIG. 7 is a waveform diagram illustrating an example of operation waveforms on a lower arm side of a power module 1.

FIG. 7 is a waveform diagram illustrating an example of operation waveforms on the lower arm side of the power module 1.

FIG. 7 illustrates an example when the driving signal InX (the driving signal for the switching device 5X) and the driving signal InY (the driving signal for the switching device 5Y) change.

For example, the driving signal InX is switched (falls) from high to low at time T1. In response to this switching, the signal OutX outputted from the driver circuit 60X rises from low to high, to thereby turn on the switching device 5X. In driving the switching device 5X as above, noise is generated in a time period from time T2 to T3 in the voltage TiX across the diode 6X in the same chip as that provided with the switching device 5X. In this time period (from time T2 to T3), noise is generated also in the voltage TiY of the diode 6Y in a chip (the semiconductor chip 4Y in FIG. 7) other than the same chip. Similarly, noise is generated also in the voltage TiZ of the diode 6Z (not illustrated). When such noise is contained in the voltages TiX, TiY, and TiZ, the accuracy of the driving capacity adjustment of the driving-capability adjustment circuits 50X, 50Y, and 50Z is reduced. For example, the outputs of the comparators 51 and 52 may be switched due to noise, which can prevent the selection circuit 54 from selecting (allowing conduction of) an appropriate one among the switches SW1 to SW3.

Thus, an embodiment of the present disclosure includes the edge detection circuit 10 and the sample hold circuits 30X, 30Y, and 30Z. During the time period during which the edge detection circuit 10 is generating a pulse of the signal Hold (from time T2 to T3), the sample hold circuit 30X holds the voltage TiX that has been received immediately before this time period. The sample hold circuit 30X outputs the received voltage TiX in a time period other than the above time period (the time period during which no pulse is being generated). Thus, the effects (noise) of fluctuations in the anode potential of the diode 6X is not reflected on the voltage ToX outputted from the sample hold circuit 30X (that is, the noise is removed).

In addition, since the sample hold circuits 30Y and 30Z performs the same processing as the sample hold circuit 30X, in response to the signal Hold, noise generated in the diodes 6Y and 6X is not reflected on the voltages ToY and ToZ. As such, even if noise is generated in the diodes 6X, 6Y, and 6Z in turning on the switching device 5X, such noise is not reflected on the outputs (the voltages ToX, ToY, and ToZ) of the sample hold circuits 30X, 30Y, and 30Z.

In addition, at time T4, the driving signal InY is switched (falls) from high to low. In response to this, the signal OutY outputted from the driver circuit 60Y rises from low to high, to thereby turn on the switching device 5Y. In this process, noise is generated in a time period from time T5 to T6 in the voltage TiY of the diode 6Y as well as the voltage TiX of the diode 6X (and the voltage TiZ of the diode 6Z). In this case, the same processing as that in the time period from time T2 to T3 is performed with the pulse of the signal Hold in the time period from the time T5 to T6. Thus, the noise is not reflected on the outputs (the voltages ToX, ToY, and ToZ) of the sample hold circuits 30X, 30Y, and 30Z. The same applies to the case where the driving signal InZ changes in level (to drive the switching device 5Z), although not illustrated.

As such, even if noise is generated in the outputs of the diodes 6X, 6Y, and 6Z due to driving of any of the switching devices 5X, 5Y, and 5Z, the hold operation by the edge detection circuit 10 and the sample hold circuits 30X, 30Y, and 30Z prevents reflection of the effects of noise.

This can reduce the effects of noise, thereby being able to operate with appropriate driving capabilities.

An example described above explains a case of reducing noise when the driving signal InX or the like is switched from high to low (to turn on each switching device). However, the same processing can prevent reflection of noise also when the driving signal InX or the like is switched from low to high (to turn off each switching device). A configuration may be such that noise is reduced only when the driving signal InX or the like is switched from high to low (to turn on each switching device).

<<<Configuration Example on Upper Arm Side>>>

An embodiment according to the present disclosure described above explains a configuration on the lower arm side, but the present disclosure is applicable to a configuration on the upper arm side in a similar manner. In the following, only part of a configuration on the upper arm side will be described without describing a configuration on the lower arm side since the configuration on the lower arm side is as in an embodiment described above.

Figure 8:
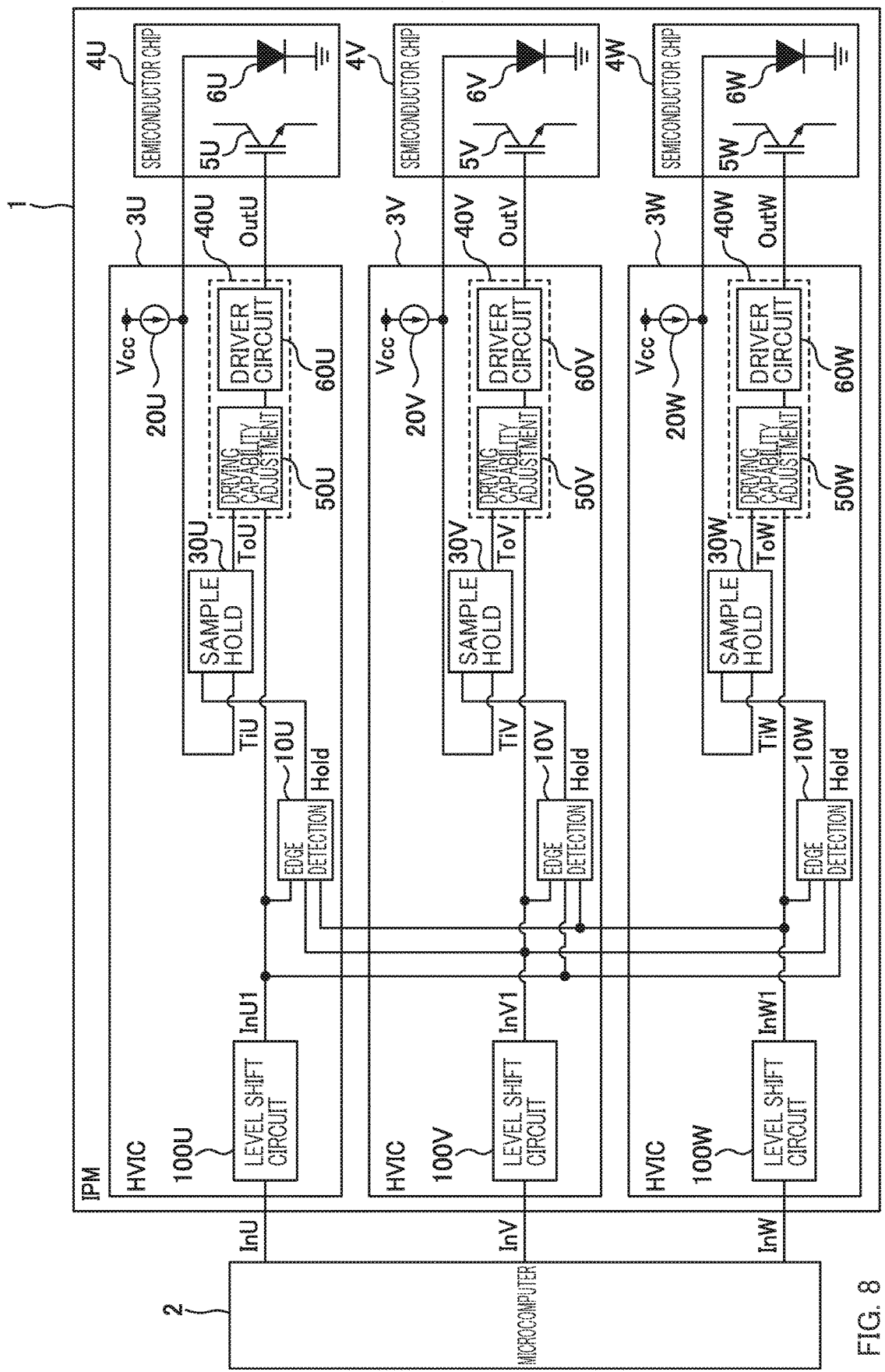
FIG. 8 is a block diagram illustrating an example of a configuration on an upper arm side.

FIG. 8 is a block diagram illustrating an example of the configuration on the upper arm side.

As illustrated in FIG. 8, on the upper arm side, the HVICs 3U, 3V, and 3W and semiconductor chips 4U, 4V, and 4W are provided with respect to three phases (U-, V-, and W-phases), respectively. The HVICs 3U, 3V, and 3W include level shift circuits 100U, 100V, and 100W, respectively.

The semiconductor chips 4U, 4V, and 4W include the switching devices 5U, 5V, and 5W and the diodes 6U, 6V, and 6W, respectively. These configurations are the same as those on the lower arm side (the semiconductor chips 4X, 4Y, and 4Z), and the description thereof is omitted. Power supply voltage of high voltage (for example, 600 V) is applied to the collectors of the switching devices 5U, 5V, and 5W included in the semiconductor chips 4U, 4V and 4W, respectively. In response to being turned on, the switching devices 5U, 5V, and 5W supply electric power to the three-phase motor 7 on the emitter side.

Note that any one of the semiconductor chips 4U, 4V, and 4W (herein, the semiconductor chip 4U) corresponds to the "first semiconductor chip", and another one (herein, the semiconductor chip 4V) corresponds to the "second semiconductor chip".

The switching device 5U provided to the semiconductor chip 4U corresponds to the "first switching device", and the diode 6U corresponds to the "first diode". The output (the voltage TiU) of the diode 6U corresponds to the "first voltage".

The switching device 5V corresponds to the "second switching device", and the diode 6V corresponds to the "second diode". The output (the voltage TiV) of the diode 6V corresponds to the "second voltage".

The HVIC 3U includes the level shift circuit 100U, an edge detection circuit 10U, a constant current source 20U, a sample hold circuit 30U, and a control circuit 40U (a driving-capability adjustment circuit 50U, a driver circuit 60U). The HVICs 3V and 3W each include the same configuration as that of the HVIC 3U. The HVIC 3U corresponds to a "first integrated circuit", and the HVIC 3V corresponds to a "second integrated circuit".

The level shift circuit 100U translates (shifts) the driving signal InU outputted from the microcomputer 2 to a signal of a voltage level capable of driving the switching device 5U, and outputs the resultant signal as a driving signal InU1.

Similarly, the level shift circuits 100V and 100W translates the driving signals InV and InW outputted from the microcomputer 2, in terms of level, and outputs resultant signals as driving signals InV1 and InW1, respectively. The level shift circuit 100U corresponds to a "first level shift circuit", the driving signal InU corresponds to the "first driving signal", and the driving signal InU1 corresponds to a "level-shifted first driving signal". The level shift circuit 100V corresponds to a "second level shift circuit", the driving signal InV corresponds to the "second driving signal", and the driving signal InV1 corresponds to a "level-shifted second driving signal".

The edge detection circuits 10U, 10V, and 10W have the same configuration as that of the edge detection circuit 10. The edge detection circuits 10U, 10V, and 10W detect edges from the driving signals InU1, InV1, and InW1, respectively, to output the signal Hold. As illustrated in FIG. 8, on the upper arm side, the HVICs 3U, 3V, and 3W include the edge detection circuits 10U, 10V, and 10W, respectively. Note that the edge detection circuit 10U corresponds to a "first signal output circuit", and the edge detection circuit 10V corresponds to a "second signal output circuit". The signal Hold corresponds to the "timing signal".

The sample hold circuit 30U and the control circuit 40U (the driving-capability adjustment circuit 50U, the driver circuit 60U) have the same configurations as those on the lower arm side, and the description thereof is omitted. The HVICs 3V and 3W have the same configurations as that of the HVIC 3U, and the description thereof is omitted. The sample hold circuit 30U corresponds to the "first hold circuit", and the control circuit 40U corresponds to the "first control circuit". The sample hold circuit 30V corresponds to the "second hold circuit", and the control circuit 40V corresponds to the "second control circuit".

With such a configuration, it is possible to reduce the effects of noise on the upper arm side as well, thereby being able to operate with appropriate driving capabilities.

<<Modification on Upper Arm Side>>

Figure 9:
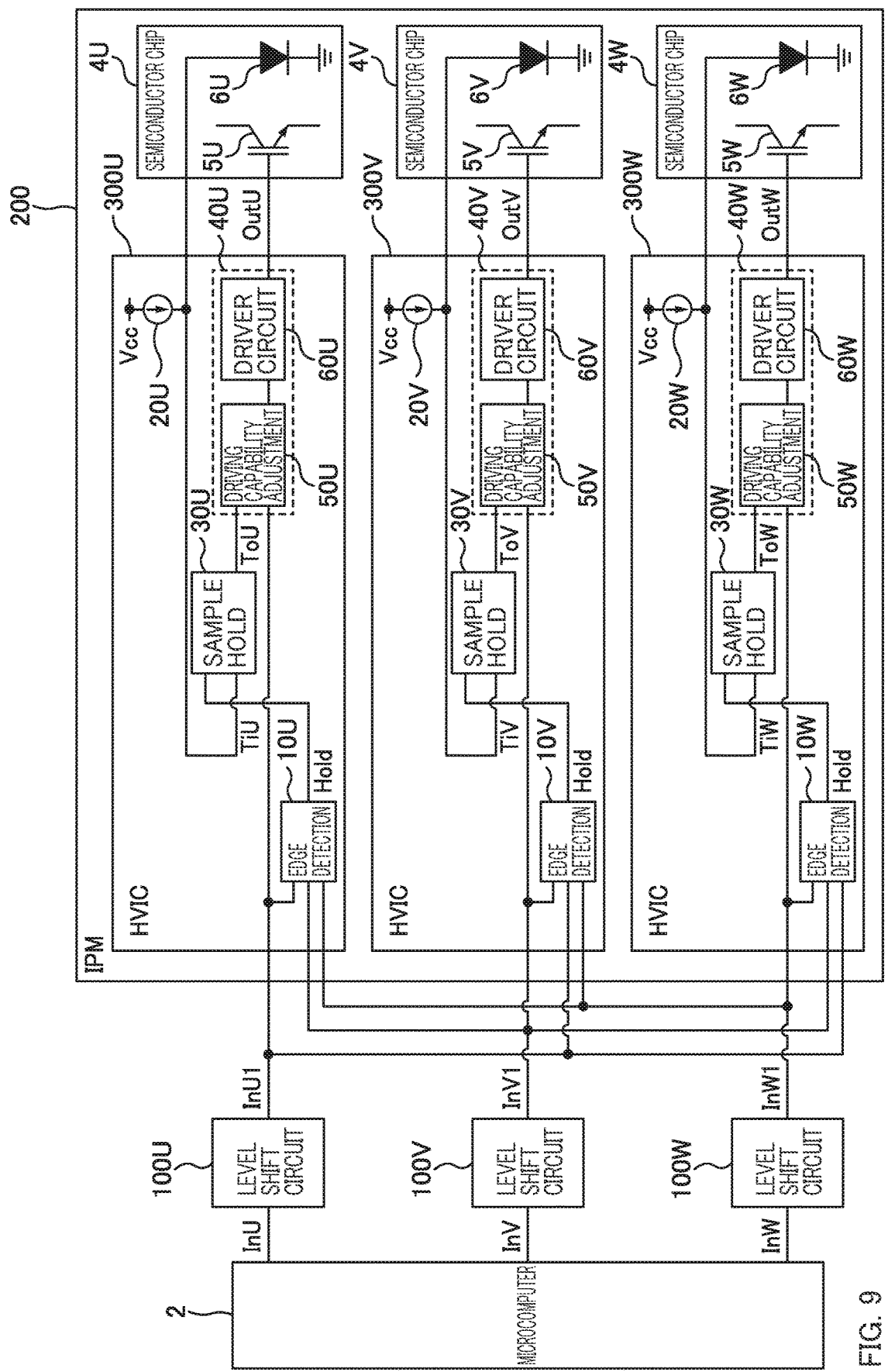
FIG. 9 is a block diagram illustrating a modification of a configuration on an upper arm side.

FIG. 9 is a block diagram illustrating a modification of the configuration on the upper arm side. In FIG. 9, parts or elements that are the same as those illustrated in in FIG. 8 are given the same reference numerals, and a description thereof is omitted. A power module 200 illustrated in FIG. 9 includes HVICs 300U, 300V, and 300W. The HVICs 300U, 300V, and 300W are different from the HVICs 3U, 3V, and 3W in not including the level shift circuits 100U, 100V, and 100W, respectively.

In this modification, the level shift circuits 100U, 100V, and 100W are provided outside of the power module 200. As such, the level shift circuits 100U, 100V, and 100W may be provided outside of the power module 200 (the HVICs 300U, 300V, and 300W).

SUMMARY

The power module 1 according to an embodiment of the present disclosure has been described hereinabove. The LVIC 3 on the lower arm side includes the edge detection circuit 10, the sample hold circuits 30X, 30Y, and 30Z, and the control circuits 40X, 40Y, and 40Z. The edge detection circuit 10 outputs the signal Hold indicating switching timings of the switching devices 5X, 5Y, and 5Z. The sample hold circuit 30X receives the voltage TiX of the diode 6X corresponding to the temperature of the switching device 5X, and the signal Hold. The sample hold circuit 30X holds the voltage TiX for a predetermined time period, in response to receiving a pulse of the signal Hold, and outputs the received voltage TiX as it is (the same applies to the sample hold circuits 30Y and 30Z) in response to the predetermined time period having elapsed. Based on the voltage ToX outputted from the sample hold circuit 30X and the driving signal InX for driving the switching device 5X, the control circuit 40X controls switching of the switching device 5X with driving capability corresponding to the temperature of the switching device 5X (the same applies to the control circuits 40Y and 40Z). This makes it possible to reduce effects of noise with respect to each phase, thereby being able to operate with appropriate driving capabilities.

The edge detection circuit 10 outputs the signal Hold, which indicates timings of turning on and off of the switching devices 5X, 5Y, and 5Z. This makes it possible to reduce the effects of noise that is generated in the outputs of the diodes 6X, 6Y, and 6Z in the timing in which the switching devices 5X, 5Y, and 5Z are turned on and off.

The edge detection circuit 10 includes: the pulse generation circuit 11X configured to output, in response to the driving signal InX, the pulse signal O1 containing a pulse having a pulse width of a predetermined time period; the pulse generation circuit 11Y configured to output, in response to the driving signal InY, the pulse signal O2 containing a pulse having a pulse width of a predetermined time period; the pulse generation circuit 11Z configured to output, in response to the driving signal InZ, the pulse signal O3 containing a pulse having a pulse width of a predetermined time period; and the OR circuit 12 configured to output the OR of the pulse signals O1, O2, and O3 as the signal Hold. Accordingly, the edge detection circuit 10 can generate the signal Hold indicating switching timings of the switching devices 5X, 5Y, and 5Z.

The pulse generation circuit 11X delays the start timing of the pulse of the pulse signal O1 (time T2) with respect to the switching timing of the logical level of the driving signal InX (time T1). The pulse generation circuit 11Y delays the start timing of the pulse of the pulse signal O2 (time T5) with respect to the switching timing of the logic level of the driving signal InY (time T4). The pulse generation circuit 11Z delays the start timing of the pulse of the pulse signal O3 (time T8) with respect to the switching timing of the logic level of the driving signal InZ (time T7). This makes it possible to generate a pulse in a time period during which noise is likely to be generated, thereby being able to efficiently reduce the effects of noise.

A delay circuit configured to delay the signal Hold outputted from the OR circuit 12 may be provided in the stage subsequent to the OR circuit 12, with the pulse generation circuits 11X, 11Y, and 11Z having no delay function. In this case as well, it is also possible to generate a pulse in a time period during which noise is likely to be generated, thereby being able to efficiently reduce the effects of noise.

The pulse widths of pulses of the signal Hold (the pulse signals O1 to O3) are shorter than time periods during which the switching devices 5X, 5Y, and 5Z are on. This reduces the time period during which the results of detection of the diodes 6X, 6Y, and 6Z are not reflected on the adjustment of the driving capability.

The power module 1 includes, as the components on the lower arm side, the semiconductor chip 4X that includes the switching device 5X and the diode 6X that is configured to output the voltage TiX corresponding to the temperature of the switching device 5X; the semiconductor chip 4Y that includes the switching device 5Y and the diode 6Y that is configured to output the voltage TiY corresponding to the temperature of the switching device 5Y; the semiconductor chip 4Z that includes the switching device 5Z and the diode 6Z that is configured to output the voltage TiZ corresponding to the temperature of the switching device 5Z; and the aforementioned LVIC 3 configured to drive the switching devices 5X, 5Y, and 5Z. This makes it possible to reduce the effects of noise with respect to each phase, thereby being able to operate with appropriate driving capabilities.

The power module 1 includes, as the components on the upper arm side, the semiconductor chip 4U that includes the switching device 5U and the diode 6U configured to output the voltage TiU corresponding to the temperature of the switching device 5U; and the HVIC 3U that includes the level shift circuit 100U configured to shift the level of the driving signal InU for driving the switching device 5U, the HVIC 3U being configured to drive the switching device 5U. With respect to the V- and W-phases as well, the power module 1 includes the semiconductor chip 4V and HVIC 3V, and includes the semiconductor chip 4W and HVIC 3W, respectively. The HVICs 3U, 3V, and 3W include the edge detection circuits 10U, 10V, and 10W, the sample hold circuits 30U, 30V, and 30W, and the control circuits 40U, 40V, and 40W, respectively. This makes it possible to reduce the effects of noise on the upper arm side, thereby being able to operate with appropriate driving capabilities.

The present disclosure is directed to provision of an integrated circuit and a power module that are capable of reducing the effects of noise and operating with appropriate driving capability.

According to the present disclosure, it is possible to provide an integrated circuit and a power module that are capable of minimizing the effects of noise and operating with appropriate driving capability.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. An integrated circuit for controlling a power module that includes a first switching device and a second switching device, the integrated circuit comprising:
    a signal output circuit configured to output a timing signal indicating a first timing of switching the first switching device and a second timing of switching the second switching device;
    a first hold circuit configured to
        receive a first voltage corresponding to a temperature of the first switching device and the timing signal,
        hold the first voltage for a first time period in response to receiving the timing signal, and
        output the received first voltage in response to the first time period having elapsed;
    a second hold circuit configured to
        receive a second voltage corresponding to a temperature of the second switching device and the timing signal,
        hold the second voltage for a second time period in response to receiving the timing signal, and
        output the received second voltage in response to the second time period having elapsed;
    a first control circuit configured to
        receive the first voltage outputted from the first hold circuit and a first driving signal for driving the first switching device, and
        control the switching of the first switching device with a first driving capability corresponding to the temperature of the first switching device, based on the first voltage received from the first hold circuit and the first driving signal; and
    a second control circuit configured to
        receive the second voltage outputted from the second hold circuit and a second driving signal for driving the second switching device, and
        control the switching of the second switching device with a second driving capability corresponding to the temperature of the second switching device, based on the second voltage received from the second hold circuit and the second driving signal.

2. The integrated circuit according to claim 1, wherein the first timing includes timings of turning on and off of the first switching device, and
the second timing includes timings of turning on and off of the second switching device.

3. The integrated circuit according to claim 1, wherein the signal output circuit includes:
    a first pulse generation circuit configured to generate a first pulse signal containing a first pulse having a pulse width of the first time period, in response to the first driving signal;
    a second pulse generation circuit configured to generate a second pulse signal containing a second pulse having a pulse width of the second time period, in response to the second driving signal; and
    an output circuit configured to output, as the timing signal, the first and second pulse signals.

4. The integrated circuit according to claim 3, wherein the first pulse generation circuit delays a start timing of the first time period for the first pulse signal, with respect to a timing of switching a logic level of the first driving signal, and
the second pulse generation circuit delays a start timing of the second time period for the second pulse signal, with respect to a timing of switching a logic level of the second driving signal.

5. The integrated circuit according to claim 3, wherein the signal output circuit further includes:
    a delay circuit configured to delay the timing signal outputted from the output circuit.

6. The integrated circuit according to claim 1, wherein the first and second time periods are shorter than time periods during which the first and second switching devices are on, respectively.

7. A power module, comprising:
    a first semiconductor chip including a first switching device and a first diode, the first diode being configured to output a first voltage corresponding to a temperature of the first switching device;
    a second semiconductor chip including a second switching device and a second diode, the second diode being configured to output a second voltage corresponding to a temperature of the second switching device; and
    an integrated circuit configured to drive the first and second switching devices, wherein the integrated circuit includes:
        a signal output circuit configured to output a timing signal indicating a first timing of switching the first switching device and a second timing of switching the second switching device;
        a first hold circuit configured to
            receive the first voltage and the timing signal,
            hold the first voltage for a first time period in response to receiving the timing signal, and output the received first voltage in response to the first time period having elapsed;
a second hold circuit configured to
receive the second voltage and the timing signal,
hold the second voltage for a second time period in response to receiving the timing signal, and
output the received second voltage in response to the second time period having elapsed;
a first control circuit configured to
receive the first voltage outputted from the first hold circuit and a first driving signal for driving the first switching device, and
drive the first switching device with a first driving capability corresponding to the temperature of the first switching device, based on the first voltage received from the first hold circuit and the first driving signal; and
a second control circuit configured to
receive the second voltage outputted from the second hold circuit and a second driving signal for driving the second switching device, and
drive the second switching device with a second driving capability corresponding to the temperature of the second switching device, based on the second voltage received from the second hold circuit and the second driving signal.

8. A power module, comprising:
a first semiconductor chip including a first switching device and a first diode, the first diode being configured to output a first voltage corresponding to a temperature of the first switching device;
a first integrated circuit including a first level shift circuit configured to shift a level of a first driving signal for driving the first switching device, the first integrated circuit being configured to drive the first switching device;
a second semiconductor chip including a second switching device and a second diode, the second diode being configured to output a second voltage corresponding to a temperature of the second switching device; and
a second integrated circuit including a second level shift circuit configured to shift a level of a second driving signal for driving the second switching device, the second integrated circuit being configured to drive the second switching device,
wherein
the first integrated circuit includes:
a first signal output circuit configured to output a first timing signal indicating a first timing of switching the first switching device;
a first hold circuit configured to
receive the first voltage and the first timing signal,
hold the first voltage for a first time period in response to receiving the first timing signal, and
output the received first voltage in response to the first time period having elapsed; and
a first control circuit configured to control the switching of the first switching device with a first driving capability corresponding to the temperature of the first switching device, based on the first voltage outputted from the first hold circuit and the level-shifted first driving signal, and
the second integrated circuit includes:
a second signal output circuit configured to output a second timing signal indicating the second timing of switching the second switching device;
a second hold circuit configured to
receive the second voltage and the second timing signal,
hold the second voltage for a second time period in response to receiving the second timing signal, and
output the received second voltage in response to the second time period having elapsed; and
a second control circuit configured to control the switching of the second switching device with a second driving capability corresponding to the temperature of the second switching device, based on the second voltage outputted from the second hold circuit and the level-shifted second driving signal.

* * * * *